(12) United States Patent
Arnold et al.

(10) Patent No.: US 8,767,408 B2
(45) Date of Patent: Jul. 1, 2014

(54) THREE DIMENSIONAL PASSIVE MULTI-COMPONENT STRUCTURES

(75) Inventors: Shawn X. Arnold, San Jose, CA (US);
Douglas P. Kidd, San Jose, CA (US);
Sean A. Mayo, San Francisco, CA (US);
Scott P. Mullins, Morgan Hill, CA (US);
Dennis R. Pyper, San Jose, CA (US);
Jeffrey M. Thoma, Mountain View, CA (US); Kenyu Tojima, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/592,037

(22) Filed: Aug. 22, 2012

(65) Prior Publication Data

US 2013/0201615 A1   Aug. 8, 2013

Related U.S. Application Data

(60) Provisional application No. 61/596,689, filed on Feb. 8, 2012.

(51) Int. Cl.
*H05K 1/18* (2006.01)

(52) U.S. Cl.
USPC ........... 361/761; 361/777; 361/763; 361/762; 361/742; 361/301.1; 174/260; 174/267

(58) Field of Classification Search
None
See application file for complete search history.

(56) References Cited

U.S. PATENT DOCUMENTS

| | | | |
|---|---|---|---|
| 5,939,782 A * | 8/1999 | Malladi | 257/698 |
| 6,239,485 B1 | 5/2001 | Peters et al. | |
| 6,373,714 B1 * | 4/2002 | Kudoh et al. | 361/760 |
| 6,474,475 B1 | 11/2002 | Bjork | |
| 6,532,143 B2 * | 3/2003 | Figueroa et al. | 361/301.4 |
| 7,042,086 B2 | 5/2006 | Shimoida et al. | |
| 7,246,434 B1 | 7/2007 | Taylor et al. | |
| 7,667,312 B2 | 2/2010 | Kawakami et al. | |
| 7,960,822 B2 | 6/2011 | Kim et al. | |
| 2002/0159243 A1 | 10/2002 | Ogawa et al. | |
| 2002/0195700 A1 * | 12/2002 | Li | 257/700 |
| 2003/0173673 A1 | 9/2003 | Val | |
| 2004/0124511 A1 | 7/2004 | Li | |
| 2004/0156177 A1 * | 8/2004 | Higashitani | 361/777 |
| 2005/0168960 A1 | 8/2005 | Asahi et al. | |
| 2009/0152690 A1 | 6/2009 | Li et al. | |
| 2010/0091427 A1 * | 4/2010 | Lee et al. | 361/306.3 |
| 2011/0013373 A1 | 1/2011 | Lin et al. | |
| 2011/0108948 A1 | 5/2011 | Kim et al. | |
| 2011/0121456 A1 | 5/2011 | Caron et al. | |
| 2011/0317387 A1 | 12/2011 | Pan et al. | |

OTHER PUBLICATIONS

International Search Report and Written Opinion from PCT application PCT/US2013/024443 dated May 31, 2013.

* cited by examiner

*Primary Examiner* — Tuan T Dinh
*Assistant Examiner* — Steven T Sawyer
(74) *Attorney, Agent, or Firm* — Womble Carlyle Sandridge & Rice LLP

(57) ABSTRACT

Stacked arrays of components are disclosed. In one embodiment, a first and a second layer of components are electrically and mechanically coupled to an interposer with an encapsulated third layer of components disposed between the first and second layers. The first layer can be configured to attach the stacked array to a host printed circuit board. The interposer can couple signals between the components on the first and second layers.

19 Claims, 14 Drawing Sheets

THREE DIMENSIONAL PASSIVE MULTI-COMPONENT STRUCTURES

CROSS-REFERENCE TO RELATED APPLICATION

This application claims priority to and benefit under 35 U.S.C. 119(e) of U.S. Provisional Patent Application Ser. No. 61/596,689, filed Feb. 8, 2012, entitled THREE DIMENSIONAL PASSIVE MULTI-COMPONENT STRUCTURES, the entire disclosure of which is hereby incorporated by reference.

BACKGROUND

1. Technical Field

The described embodiments relate generally to passive electronic components and more particularly to three dimensional structural arrays of passive components.

2. Related Art

As technology advances, product designs in general, and designs for mobile products in particular are becoming smaller and smaller. Although the use of surface mount electronic components has enabled some amount of size reduction, product designs sizes are continuing to be driven smaller. Size reductions are now being hindered by the limitations brought on by the physical area taken up by the surface mount parts. In many cases space above a circuit board is wasted, when for example a single large component requires a certain amount of space to be allowed above the circuit board.

The design limits caused by the physical area taken up by surface mount components needs to be overcome to support smaller and denser product designs. Therefore, what is desired is a way to increase the density of electronic components to enable smaller product designs.

SUMMARY

The embodiments relate to an apparatus, system, and method for efficiently stacking a number of passive components in a small area on a host printed circuit board.

In one embodiment a vertically stacked integrated array is disclosed. The vertically stacked integrated array includes at least the following: (1) a first layer having at least a first passive component; (2) a first and second conductive edge plate each of which is electrically connected to the first passive component; (3) a second layer being disposed between the first and second conductive edge plates, the second layer including a second passive component encapsulated within the second layer; and (4) a third layer including at least a third passive component having a small footprint electrical contact configured to electrically connect the second passive component by way of a micro-via to an external circuit. The external circuit is part of a host printed circuit board. The second layer is disposed between the first and third layers. The vertically stacked integrated array has a high packing density.

In another embodiment an assembly method for the vertically stacked integrated array is disclosed. The assembly method includes at least the following steps: (1) embedding a first passive component within a small printed circuit board (PCB); (2) forming a hole for a micro-via through a first surface of the small PCB to a depth sufficient to uncover an electrical connector of the first passive component; (3) plating the hole to form the micro-via with a conductive metal, thereby electrically coupling the micro-via to the electrical connector of the first passive component; (4) edge plating the small PCB with a conductive metal substrate; (5) mechanically coupling a second passive component to the first surface of the small PCB; (6) electrically coupling the first passive component to the second passive component by the micro-via; (7) mechanically coupling a third passive component to a second surface of the small PCB; (8) electrically coupling the third passive component to the second passive component by the edge plating; and (9) mechanically and electrically coupling the second passive component to a host PCB. The vertically stacked integrated array minimizes surface area taken up by the passive components on the host PCB by vertically stacking the first, second and third passive components.

In another embodiment a computing system is disclosed. The computing system includes at least the following components: (1) a host printed circuit board (PCB); and (2) a reduced footprint passive component module. The reduced footprint passive component module includes at least the following: (1) an intermediate layer, including a module PCB having a first surface and a second surface; (2) edge plating disposed on a peripheral portion of the module PCB, and arranged to couple electrical signals between the first and second surfaces of the module PCB; (3) a component layer, comprising a first passive component mechanically coupled to the first surface of the module PCB and electrically coupled directly to the edge plating on the module PCB; (4) an attaching layer, comprising a second passive component mechanically coupled to the second surface of the module PCB and electrically coupled directly to the edge plating on the module PCB; and (5) a third passive component encapsulated within the module PCB and in electrical communication with the second passive component by a micro-via extending from the third passive component, and through the first surface of the module PCB. The second passive component is mechanically and electrically coupled to a circuit on the host PCB by at least an electrical trace arranged on a surface portion of the first PCB. The intermediate layer, component layer and attaching layer are all vertically disposed in relation to one another.

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION OF SELECTED EMBODIMENTS

Figure 1:
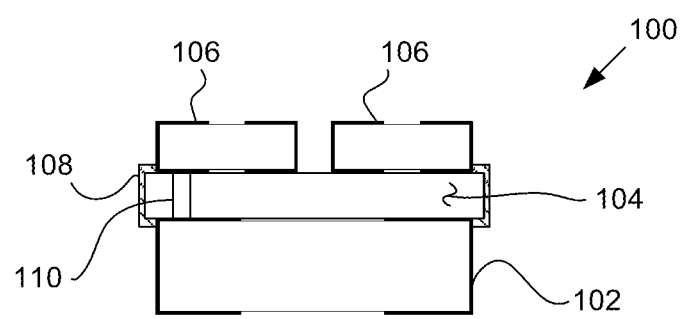
FIG. 1 is a block diagram of one embodiment of a stacked array.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

The various aspects, embodiments, implementations or features of the described embodiments can be used separately or in any combination. In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Passive components such as capacitors, inductors, resistors, and the like are used pervasively in electronic designs. More particularly, the passive components can be mounted on to a surface of a printed circuit board (PCB) that can include electrical interconnects also referred to as traces. However, in conventional arrangements, the passive components are laterally mounted to the PCB in such a way that valuable surface area of the PCB is utilized. In this way, the component density of the PCB is adversely affected. Therefore, reducing the amount of PCB surface area dedicated to passive components can result in a both an increase in component density and ultimately a reduction in an amount of a product required to house the electronic components therein. For example, instead of laterally mounting the passive components to the surface of the PCB, at least some of the passive components can be stacked vertically having the effect of reducing the amount of PCB surface area dedicated to the passive components without affecting the functionality of the PCB. Another approach to reducing PCB surface area for mounting of passive components can rely upon embedding at least one passive component within a PCB substrate. In still other embodiments, an integrated circuit can be embedded within the PCB substrate with or without passive components.

In one embodiment, a stacked array of passive components (herein after "stacked array") includes a first layer of attaching components that can be used to attach the stacked array to a host PCB, flex circuit or any other suitable technology. Typically, the attaching components can include passive components that can also be used within the stacked array. Therefore, not only can the attaching components be used to attach the stacked array to a host PCB, but they can also be electrically functional within the stacked array.

In another embodiment, the stacked array can also include an intermediate layer. The intermediate layer can be referred to as interposer. One side of the interposer can be used to electrically and mechanically couple to the attaching components. The opposite side of the interposer can be used to support and couple to a second layer of passive components. In one embodiment the interposer can be a two sided printed circuit board having a height of about 0.2 mm.

In yet another embodiment, mounting balls, such as solder balls or solder bumps can be used as a first attaching layer. In still another embodiment, the interposer can be replaced with interposer that can encapsulate passive components as well as support and couple to other passive components above and below the interposer.

FIG. 1 is a block diagram of one embodiment of stacked array 100. Stacked array 100 can include attaching layer 102, interposer 104 and component layer 106. Passive components can be used to form attaching layer 102 and component layer 106. Passive components can include resistors, inductors, capacitors, diodes and the like. In this exemplary embodiment, attaching layer 102 can include a relatively larger component compared to component sizes in component layer 106. For example, the attaching layer 102 can be a relatively large size capacitor, while the component layer 106 can include relatively smaller sized capacitors. Such component choices for components in component layer 106 and attaching layer 102 can be driven, for example, by a required circuit implementation. The design of stacked array 100 has the flexibility to support a variety of component sizes in a variety of positions and orientations. FIG. 1 is used to illustrate a general composition of stacked array 100; however, orientation of the components can vary greatly since the placement of the components can have many degrees of freedom constrained by component sizes and overall size of stacked array 100.

The attaching layer 102 can be electrically and mechanically coupled to interposer 104. Edge plating 108 can be used to couple signals from one side of the interposer to the other. Edge plating 108 can be accomplished with copper or other metals that can be deposited on interposer 108. Edge plating 108 can advantageously reduce or eliminate the need for through vias or micro-vias 110 or other traces in or on interposer 104 to couple signals between attaching layer 102 and component layer 106. Although only three passive components are shown in the block diagram of stacked array 100, other combinations (and therefore other numbers) of passive components are possible. It should be noted that in some embodiments through vias or micro-vias can also be used to couple signals from one side of the interposer to the other.

Figure 2:
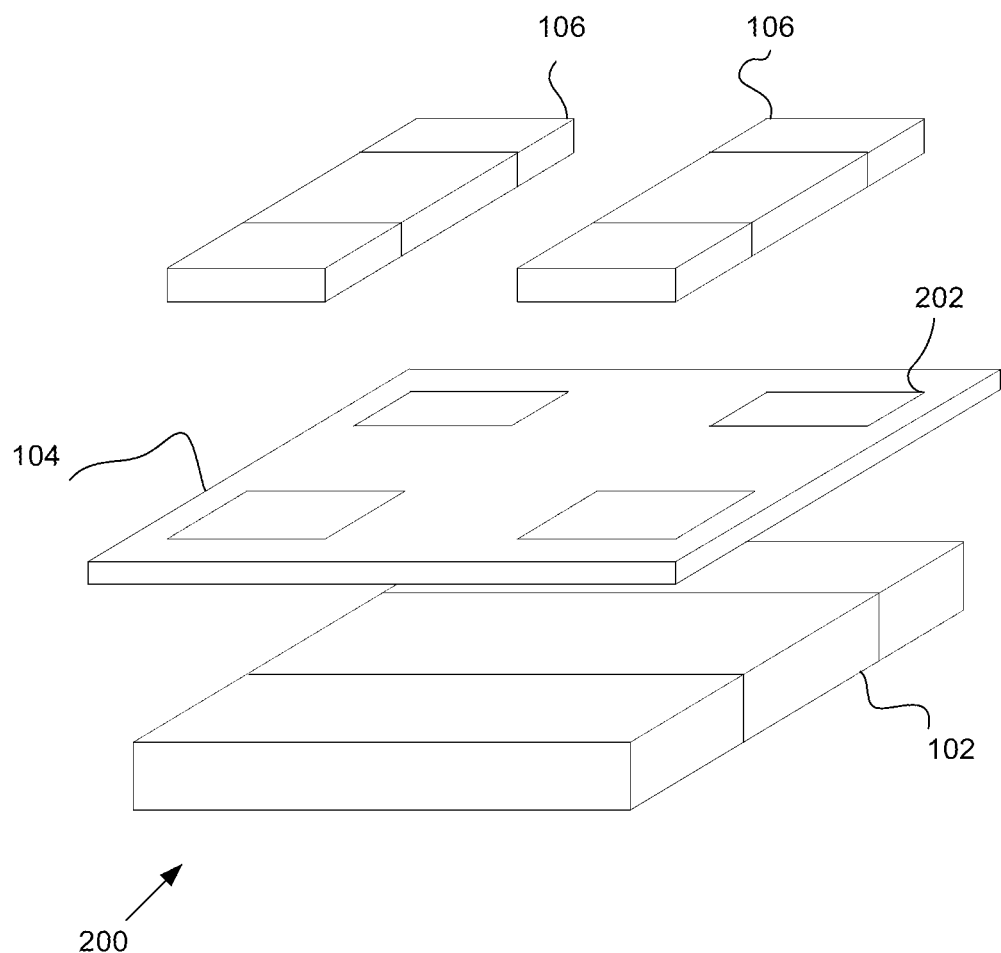
FIG. 2 is an exploded view of one embodiment of a stacked array.

FIG. 2 is an exploded view 200 of one embodiment of stacked array 100. The exploded view 200 shows attaching layer 102, interposer 104 and component layer 106. The use of stacked passive components within stacked array 100 increases the number of passive components available for use within a fixed area when compared to traditional passive component mounting techniques. Components included in attaching layer 102 can be relatively larger than components included in component layer 106 enabling the designer to position components in component layer 106 to reduce trace length and increase component part density. In this embodiment, the components in component layer 106 are configured parallel to the components in attaching layer 102. Other embodiments can support other configurations, such as components in component layer 106 perpendicular to components in attaching layer 102.

Components in component layer 106 can be attached to interposer 104. In one embodiment, the components in component layer 106 can be surface mount components that can be electrically connected, using solder for example, to interposer 104. Land patterns 202 (solder patterns) corresponding to the components in component layer 106 are shown on interposer 104. Land patterns corresponding to components on attaching layer 102 can also be placed on interposer 104; however, these land patterns are not shown in this view for clarity. Thus, components in attaching layer 102 can also be soldered to interposer 104. Not shown in this view are edge plating 108 features which can be used to couple signals from one side of interposer 104 to the other. Through vias or micro-vias 110 (not shown) can also be used to couple signals through interposer 104 as shown in FIG. 1.

Figure 3:
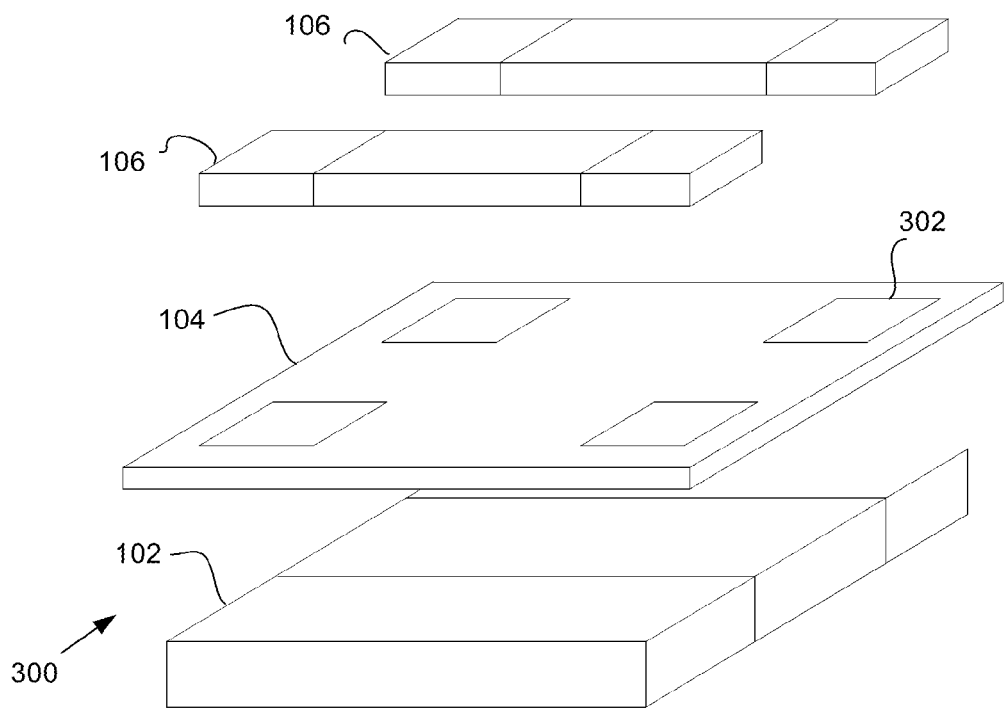
FIG. 3 is an exploded view of another embodiment of a stacked array.

FIG. 3 is an exploded view 300 of another embodiment of stacked array 100. In this embodiment, the components of component layer 106 can be placed at right angles to the components on the attaching layer 102. In this way, for example, trace length can be optimized, or signal crosstalk can be reduced between passive components. Land patterns 302 on interposer 104 can be changed to correspond to the orientation of the components in the component layer 106. Other aspects of this embodiment can be shared with the embodiment shown in FIG. 2.

Figure 4A:
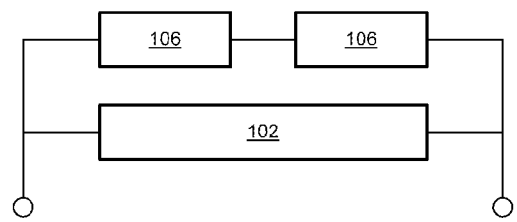
FIGS. 4A and 4B illustrate two possible circuit implementations of a stacked array.
Figure 4B:
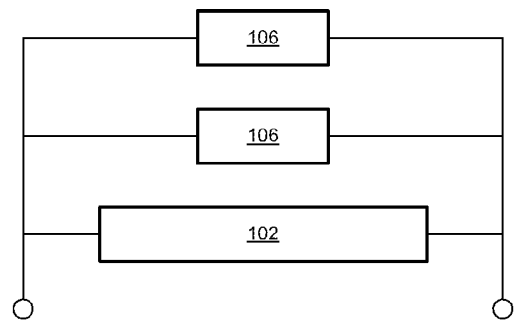

The embodiments of FIGS. 2 and 3 may be selected based on a circuit implementation desired by a designer. Circuit implementation may drive component placement configurations. FIGS. 4A-4B illustrate two possible circuit implementations. FIG. 4A shows components of component layer 106 connected in series and further connected to components of attaching layer 102 in parallel. FIG. 4B shows all components 102 and 106 connected in parallel. FIGS. 4A-4B is not meant to be exhaustive, but rather illustrative in showing possible configurations that can be supported by stacked array 100. Persons skilled in the art will recognize that other configurations are possible. Any particular circuit implementation can affect the arrangement of the components on attaching 102 and additional 106 layers. Typically, components can be arranged to minimize trace length, reduce or avoid via usage, reduce parasitic inductance or affect other design goals.

Figure 5:
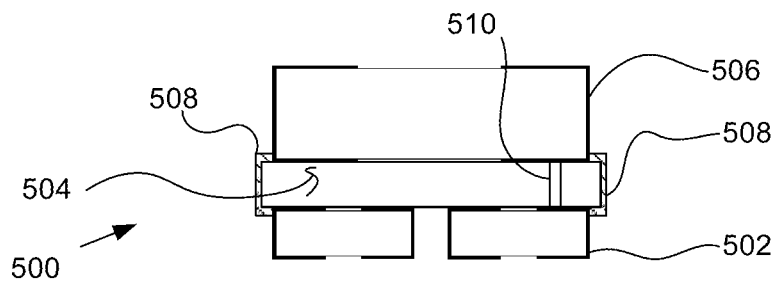
FIG. 5 is a block diagram of another embodiment of a stacked array.

FIG. 5 is a block diagram of another embodiment of stacked array 500. Stacked array 500 includes attaching layer 502, interposer 504, and component layer 506. In this embodiment, the components included in attaching layer 502 can be relatively smaller in size than the components included in component layer 506. Again, the choice of component size can be driven by design goals. Stacked array 500 (and stacked array designs in general) provide flexibility to the designer in supporting many component sizes and component orientations. Edge plating features 508 can be used to couple signals between attaching layer 502 and component layer 506. Micro-vias or through vias 510 can also be used to couple signals on interposer 504.

Figure 6:
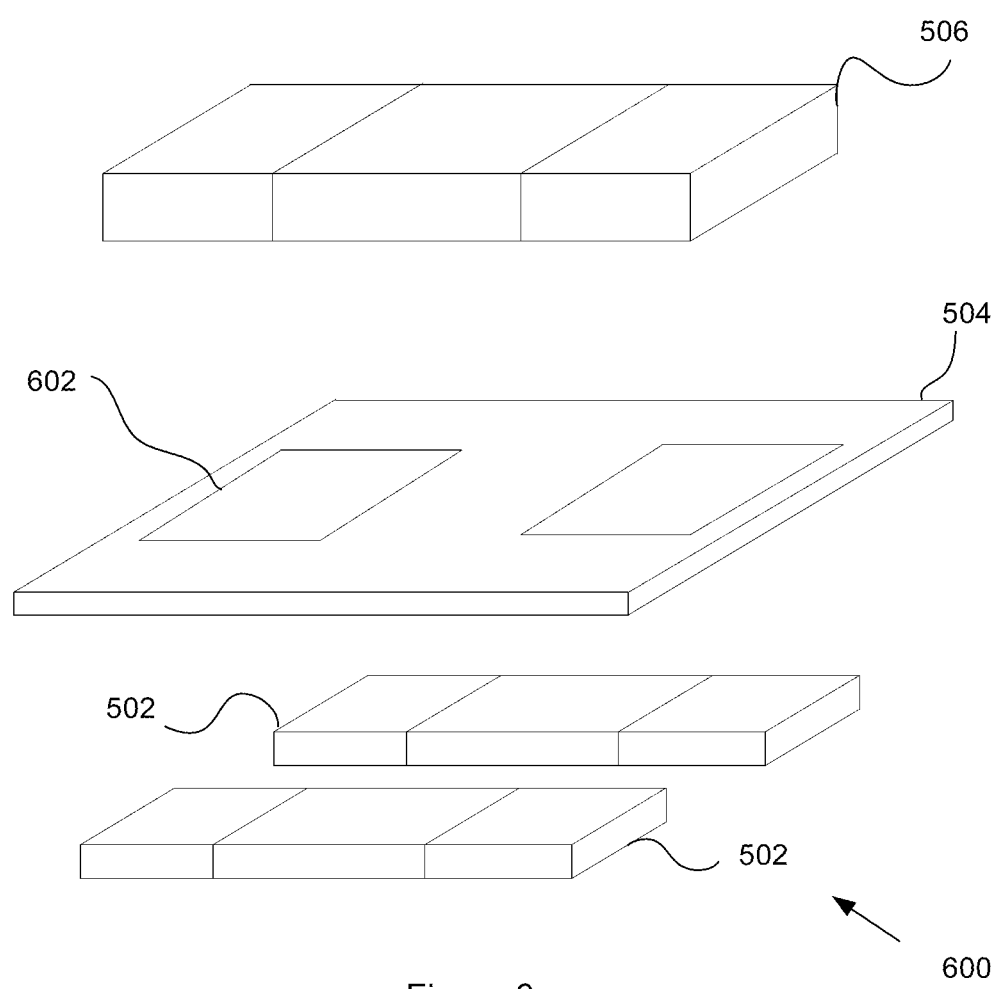
FIG. 6 is an exploded view of another embodiment of a stacked array.

FIG. 6 is an exploded view 600 of one embodiment of the stacked array 500. As shown, this embodiment can include attaching layer 502, interposer 504 and component layer 506. As described above, components forming attaching layer 502 can be relatively smaller in size than the components forming component layer 506. Land patterns corresponding to the components in attaching layer 502 and component layer 506 can be placed on interposer 504 to electrically and mechanically couple layers 502, 506 to interposer 504. Land patterns 602 corresponding to components in component layer 506 are shown on interposer 504. Land patterns corresponding to components in the attaching layer 502 are not shown for clarity. As described in FIGS. 2 and 3, the orientation of components within attaching layer 502 and/or component layer 506 can change to accommodate any particular circuit implementation and circuit design objectives.

Figure 7:
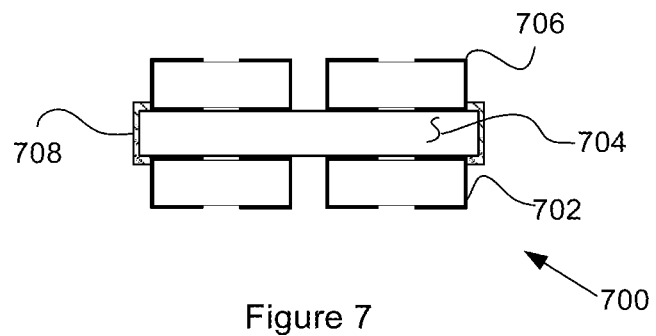
FIG. 7 is a block diagram of another embodiment of a stacked array.

FIG. 7 is a block diagram of another embodiment of a stacked array 700. Stacked array 700 can include attaching layer 702, interposer 704 and component layer 706. In this embodiment, components included in attaching layer 702 can be approximately the same size as the components included in component layer 706. As described above, the choice of using components of approximately the same size may be driven by design requirements (e.g., a particular circuit to be implemented). Stacked array 700 (and stacked array designs in general) provide flexibility to the designer in supporting many component sizes and component orientations. As described above, the components in attaching layer 702 and component layer 706 can be oriented in many ways to achieve design goals, for example, reduce trace length. Edge plating 708 can be used to couple signals between attaching layer 702 and addition layer 706.

Figure 8:
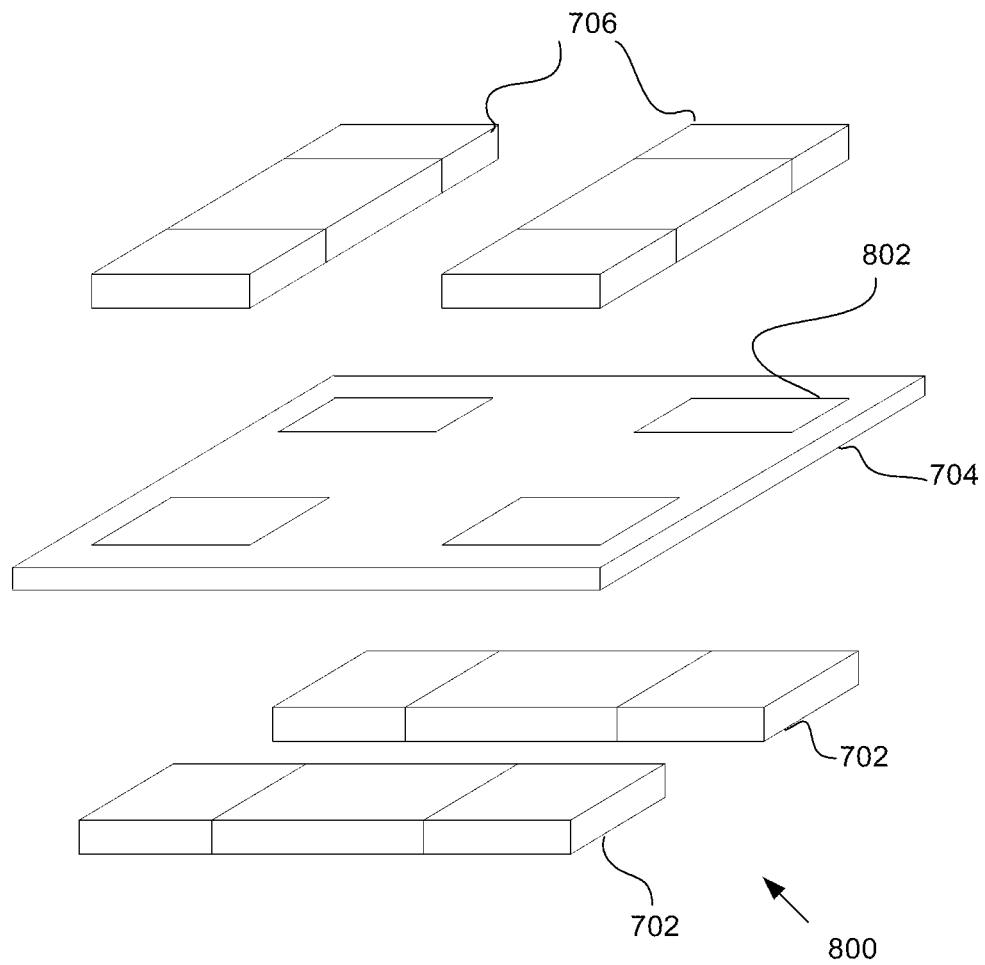
FIG. 8 is an exploded view of another embodiment of a stacked array.

FIG. 8 is an exploded view 800 of one embodiment of stacked array 700. In this embodiment, components in attaching layer 702 can be arranged at right angles to the components in the component layer 706. Such an orientation between components in attaching layer 702 and component layer 706 can optimize trace length or reduce signal crosstalk, for example. As before, land patterns 802 corresponding to the components in attaching layer 702 and component layer 706 can be placed on interposer 704 to electrically and mechanically couple layers 702, 706 to interposer 704. Land patterns 802 corresponding to components in the component layer are shown on interposer 704. Land patterns for components in the attaching layer 702 are not shown for clarity.

Figure 9:
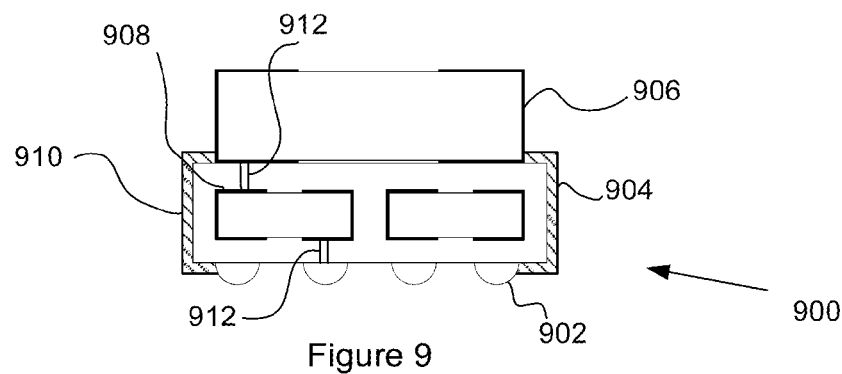
FIG. 9 is a block diagram of another embodiment of a stacked array.

FIG. 9 is a block diagram of another embodiment of a stacked array 900. Stacked array 900 includes attaching layer 902, interposer 904 and component layer 906. Attaching layer 902 can include solder balls, solder bumps or other metallic mounting balls as shown. Interposer 902 can encapsulate components 908 such as passive components within the bounds of the interposer 902. Passive components can be resistors, inductors, capacitors, diodes and the like. Encapsulating components 908 within interposer 904 may save room in a produce design by placing passive components in an otherwise unused space. In this exemplary embodiment, two passive components 908 are shown. Other embodiments can have more than or less than two encapsulated components. In this block diagram, stacked array 900 can have a single component in the component layer 906. Other embodiments can have two or more components in the component layer 906. The stacked array 900 can be mounted to a host PCB by common soldering techniques used to mount ball grid array (BGA), chip scale packages (CSP) or similar devices. Signals from attaching layer 902 can be coupled to encapsulated components 908 or component layer 906. Edge plating 910 can be used to couple signals directly from the anchor layer 902 to the component layer. Micro-vias or through vias 912 can be used to couple signals through the interposer 902.

Figure 10:
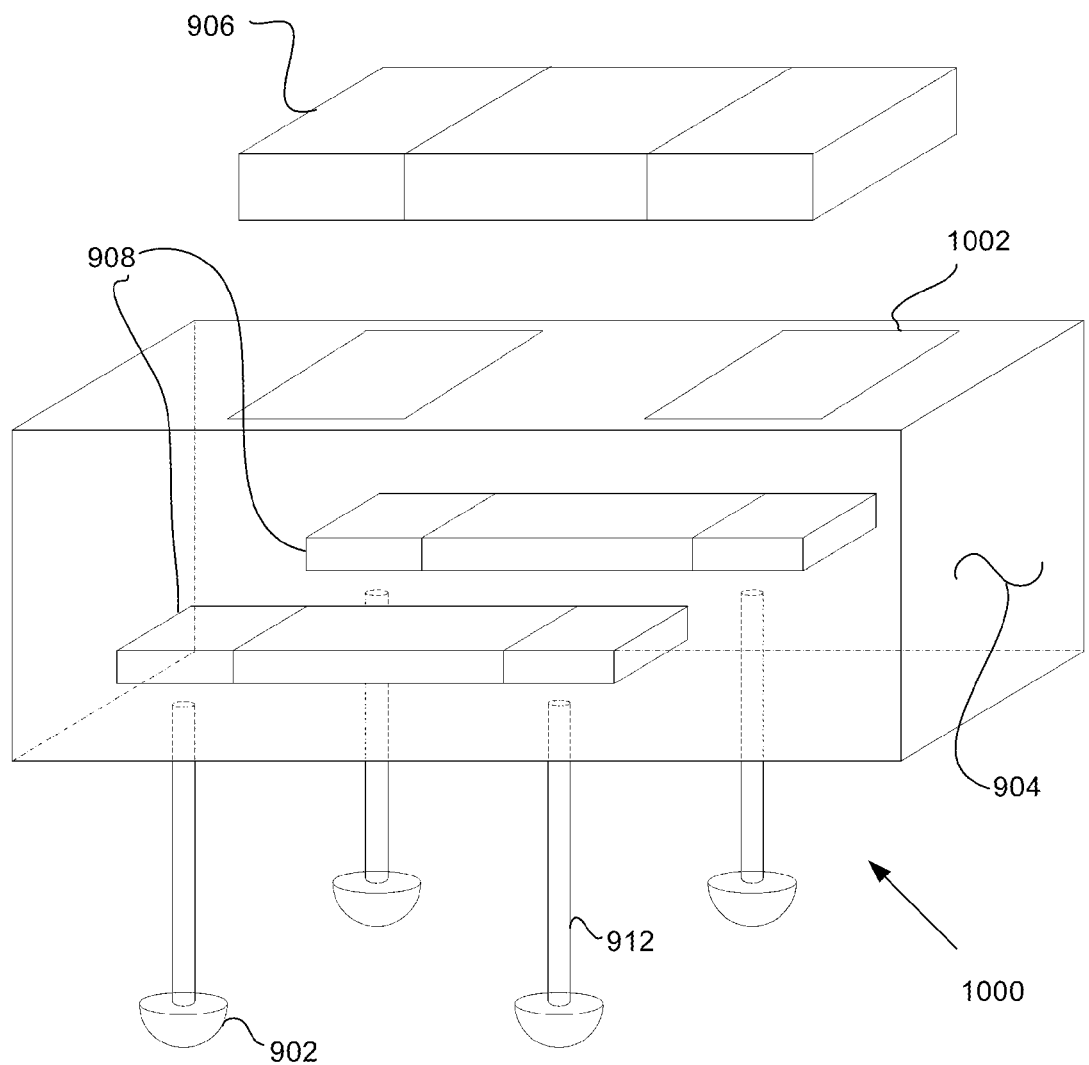
FIG. 10 is an exploded view of another embodiment of a stacked array.

FIG. 10 is an exploded view 1000 of one embodiment of stacked array 900. This embodiment includes anchor layer 902, interposer 904, and component layer 906. In this exemplary implementation, anchor layer 902 can include solder balls, solder bumps or other technically feasible means for attaching stacked array 900 and coupling signals to and from stacked array 900. As shown, two components 908 are encapsulated in interposer 904. Other embodiments can have more than or less than two components 908 in the interposer 904. Anchor layer 902 can be coupled to encapsulated components 908 through micro-vias, through vias 912 or other technically feasible means through the interposer 904. Other micro-vias, or through vias (not shown for clarity) can couple the encapsulated components 908 to land pattern 1002. Land pattern 1002 can be used to mechanically and electrically couple to component layer 906 to interposer 904. Also, edge plating 910 shown in FIG. 9 (omitted here for clarity) can couple signals from attaching layer 902 to component layer 906.

Figure 11:
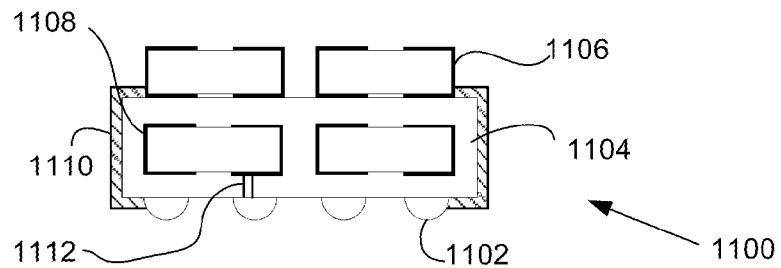
FIG. 11 is a block diagram of another embodiment of a stacked array.

FIG. 11 is a block diagram of another embodiment of stacked array 1100. Stacked array 1100 can include attaching layer 1102, interposer 1104 and component layer 1106. The interposer 1104 can encapsulate components 1108. Encapsulated components 1108 can be passive components such as resistors, inductors, capacitors, diodes and the like. Stacked array 1100 can be similar to the stacked array 900; however stacked array 1100 can include more components within the component layer 1106. Those skilled in the art will recognize that the number of components in any layer can be determined by design goals such as circuit functionality, and stacked array 1110 size. Through vias or micro-vias 1112 can couple signals from attaching layer 1102 to encapsulated components 1108, and encapsulated components 1108 to component layer 1106.

Figure 12:
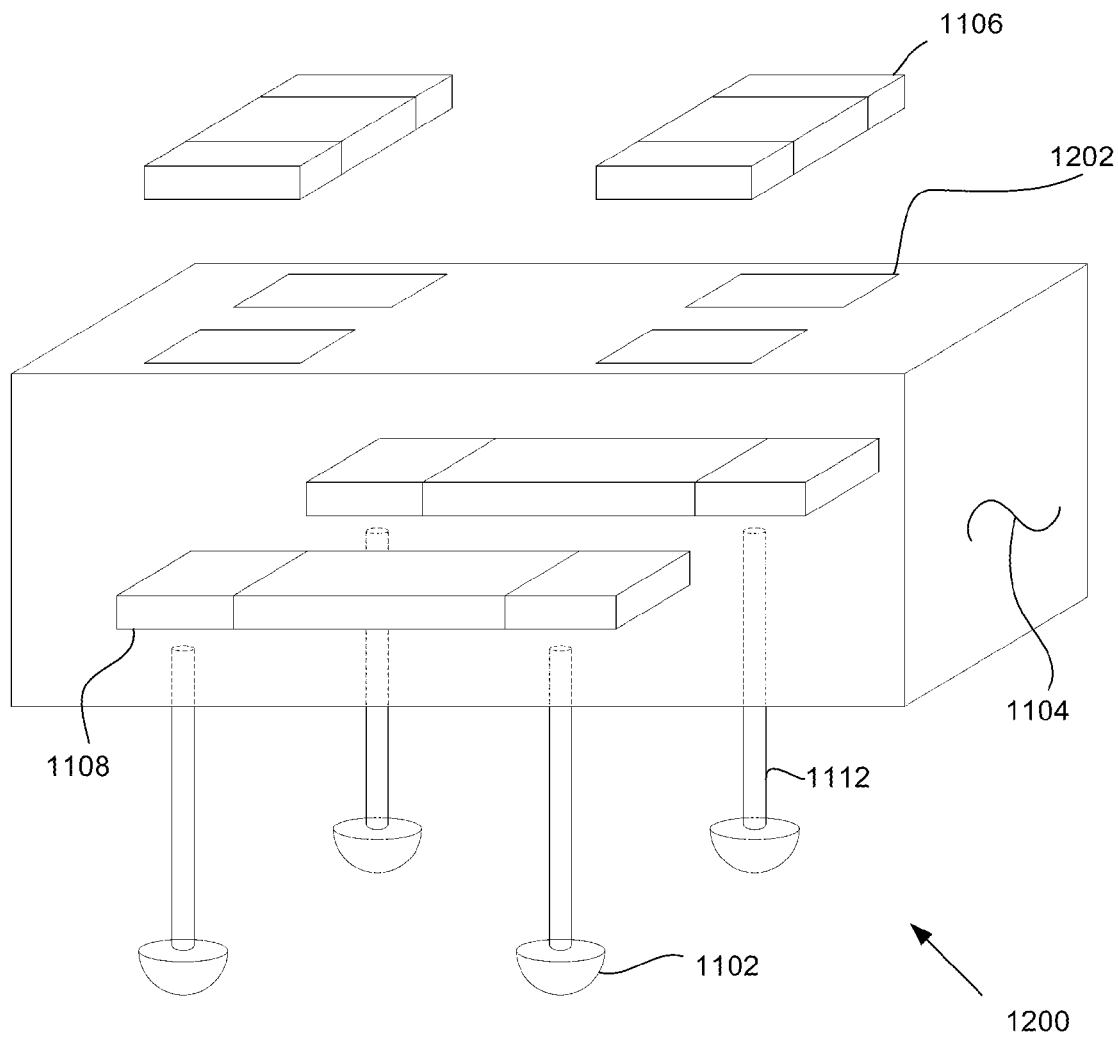
FIG. 12 is an exploded view of one embodiment of a stacked array.

FIG. 12 is an exploded view 1200 of one embodiment of the stacked array 1100. This embodiment includes attaching layer 1102, interposer 1104 and component layer 1106. The attaching layer 1102 can include solder balls, solder bumps or the like. Signals can be coupled from the attaching layer 1102 to encapsulated components 1108 using through vias or micro-vias 1112 in the manner described above in conjunction with FIG. 10. Land patterns 1202 allow components in the component layer 1106 to be mechanically and electrically coupled to interposer 1104.

Figure 13:
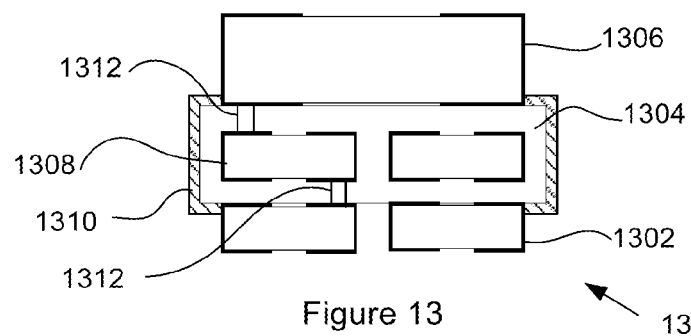
FIG. 13 is a block diagram of another embodiment of a stacked array.

FIG. 13 is a block diagram of another embodiment of a stacked array 1300. This embodiment combines elements of the attaching layer from the embodiment shown in FIG. 1 and elements of the interposer shown in FIG. 9. Stacked array 1300 can include attaching layer 1302, interposer 1304, and component layer 1306. Attaching layer 1302 and component layer 1306 can include passive components such as resistors, inductors, capacitors, diodes and the like. Interposer 1304 can encapsulate components 1308 such as passive components. Thus, stacked array 1300 using additional components in attaching layer 1302 and component layer 1306 can have a relatively higher part density due, in part, to an area on a host PCB supporting several passive components vertically. Edge plating 1310 can couple signals from attaching layer 1302 to component layer 1306. Signals can be coupled from attaching layer 1302 to encapsulated components 1308 or from component layer 1306 to encapsulated components 1308 using micro-vias or through vias 1312.

Figure 14:
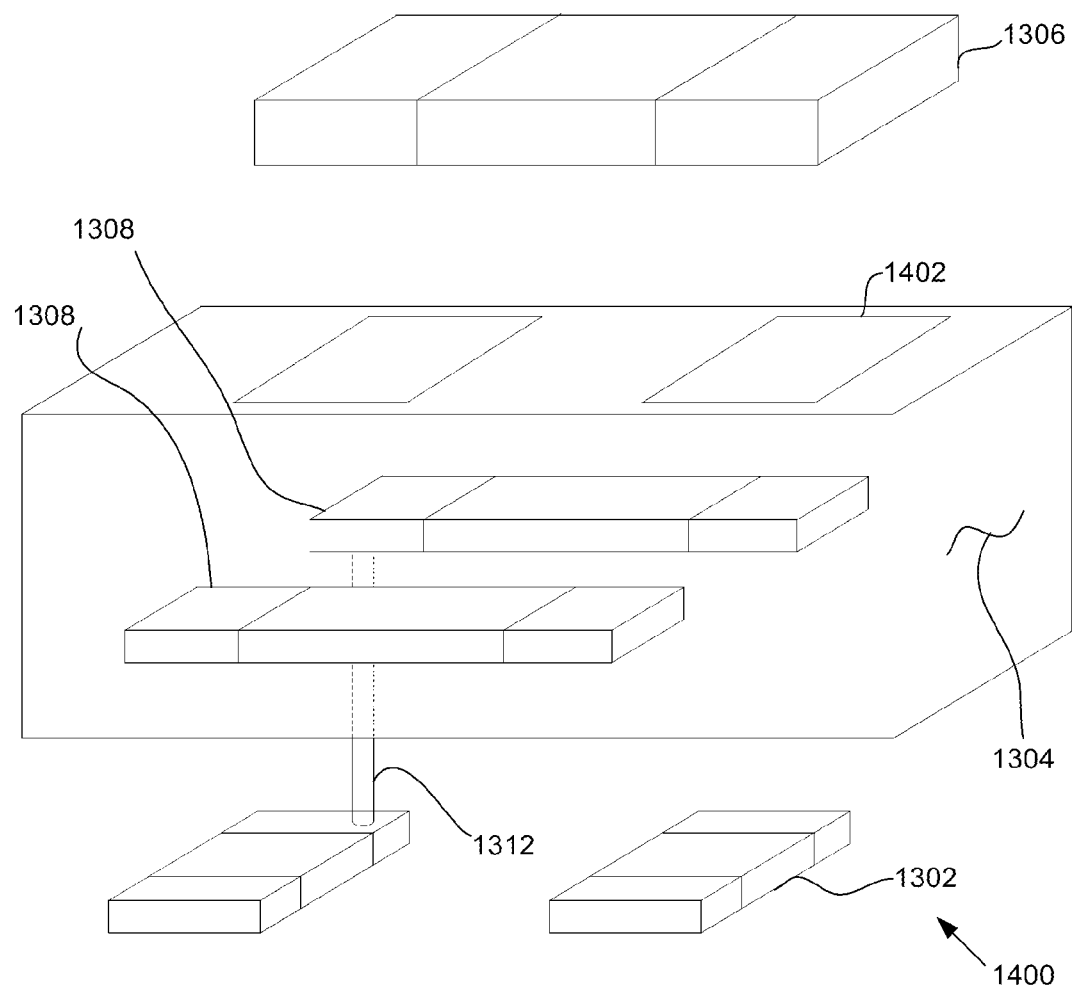
FIG. 14 is an exploded view of another embodiment of a stacked array.

FIG. 14 is an exploded view 1400 of one embodiment of stacked array 1300. This embodiment can include attaching layer 1302, interposer 1304 and component layer 1306. Interposer 1304 can encapsulate components 1308. Land patterns 1402 can be provided on interposer 1304 to mechanically and electrically couple components from the component layer 1306. Other land patterns (not shown for clarity) may be provided to electrically and mechanically couple attaching layer 1302 to interposer 1304. Stacked array 1400 can advantageously increase component part density beyond that available with either the embodiment of FIG. 1 or FIG. 9 by embedding additional passive components within the interposer 1304. Edge plating (not shown), micro-vias or through vias 1312 can couple signals from attaching layer 1302 to encapsulated components 1308 and from encapsulated components 1308 to component layer 1306.

Figure 15:
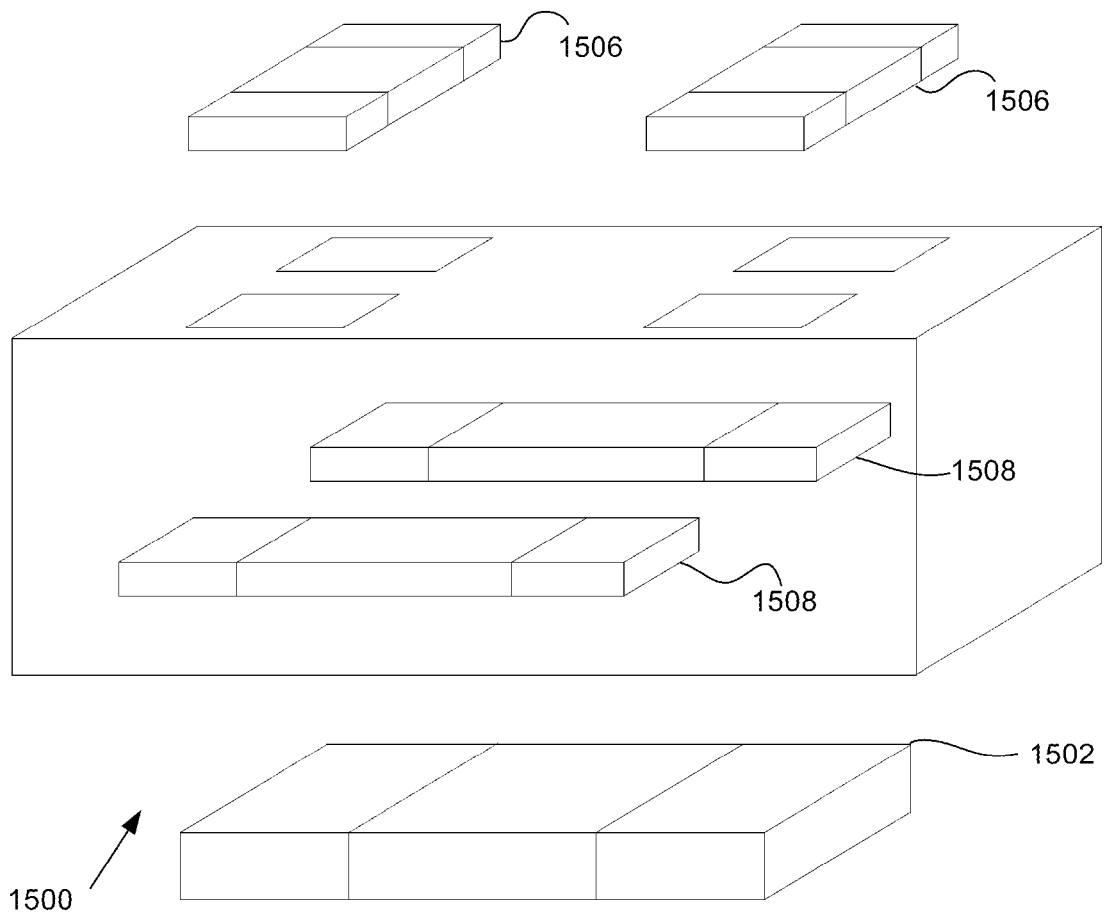
FIG. 15 is an exploded view of another embodiment of a stacked array.

FIG. 15 is an exploded view 1500 of another embodiment of stacked array 1300. In this embodiment attaching layer 1502 can include relatively larger components compared to the components in the component layer 1506. Stacked array 1300 provides the designer flexibility in choosing passive components of varying sizes to realize different circuits. Interposer 1504 can include encapsulated components 1508. Such an embodiment may be preferred over embodiment 1400 because of different signal integrity characteristics, different parasitic characteristics or the like.

Figure 16:
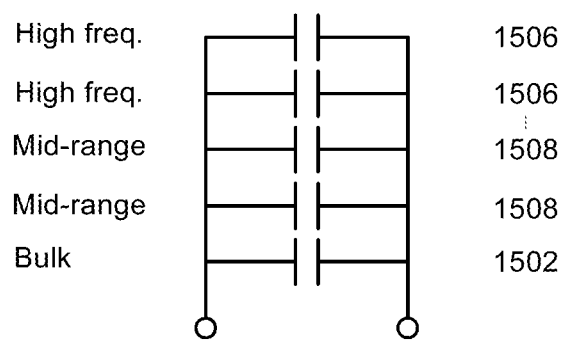
FIG. 16 shows schematic diagrams of stacked arrays.

When stacked array 1500 is implemented with capacitors, a relatively dense decoupling of filter capacitor arrays can be realized. For example, the relatively larger attaching layer 1502 component can be a bulk decoupling capacitor, encapsulated components 1508 can be mid-range decoupling capacitors and component layer 1506 components can be high frequency decoupling capacitors. This is shown schematically in FIG. 16. By coupling the three sizes of capacitors together a multi-range cap module can be achieved taking up a relatively small area. Coupling signals to be filtered (such as voltage signals) can be relatively straightforward with stacked array 1500. Attaching layer 1502 presents simply two connections making connections straightforward and can enable shorter signal routing on a host PCB.

Figure 17A:
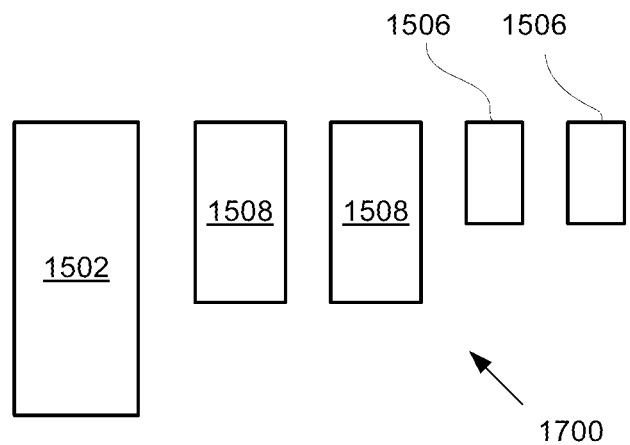
FIGS. 17A and 17B illustrate possible area usage for decoupling capacitor implementations.
Figure 17B:
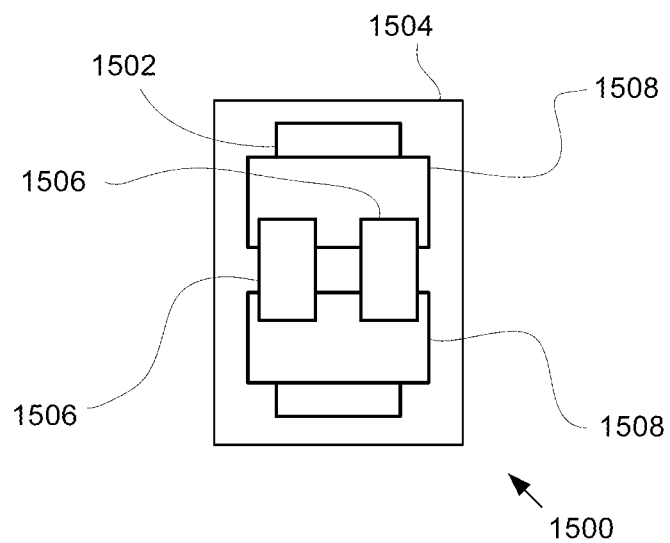

The increased density provided by stacked array 1500 is illustrated through FIGS. 17A and 17B. In FIG. 17A, bulk decoupling capacitor 1502, two mid-range decoupling capacitors 1508 and two high frequency capacitors 1506 footprints are shown. A footprint can illustrate a possible amount of host PCB area that may be used to support a discrete component; therefore, FIG. 17A shows a possible amount of host PCB area that may be needed to support these five capacitors. FIG. 17B shows a top down view of stacked array 1500. High frequency capacitors 1506 are stacked above mid-range capacitors 1508 (encapsulated in interposer 1504) which is placed above the bulk decoupling capacitor 1502. Comparing the area required for stacked array 1500 shown in FIG. 17B to the area required for the separate components in FIG. 17A highlights the improved use of area for stacked array 1500.

Figure 18:
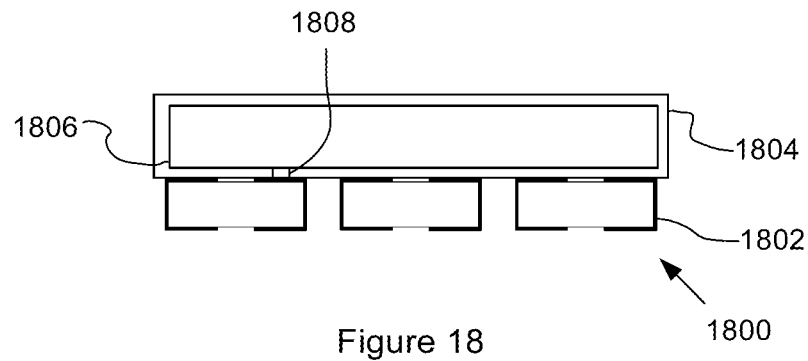
FIG. 18 is block diagram of another embodiment of a stacked array.

FIG. 18 is block diagram showing another stacked array embodiment. Stacked array 1800 includes attaching layer 1802 and interposer 1804. Attaching layer 1802 can include passive devices such as resistors, inductors, capacitors, diodes or the like. In this embodiment, interposer 1804 can encapsulate device 1806 different than passive components previously encapsulated. For example, device 1806 can be an integrated circuit. In this embodiment, coupling signals from a host PCB to encapsulated device 1806 can pass through the attaching layer 1802 through micro-vias or through vias 1808. In this way, this embodiment can reduce required area on the host PCB (compared to traditional mounting methods for device 1806) by combining the area used for the encapsulated device with area of the components used in attaching layer 1802.

Figure 19:
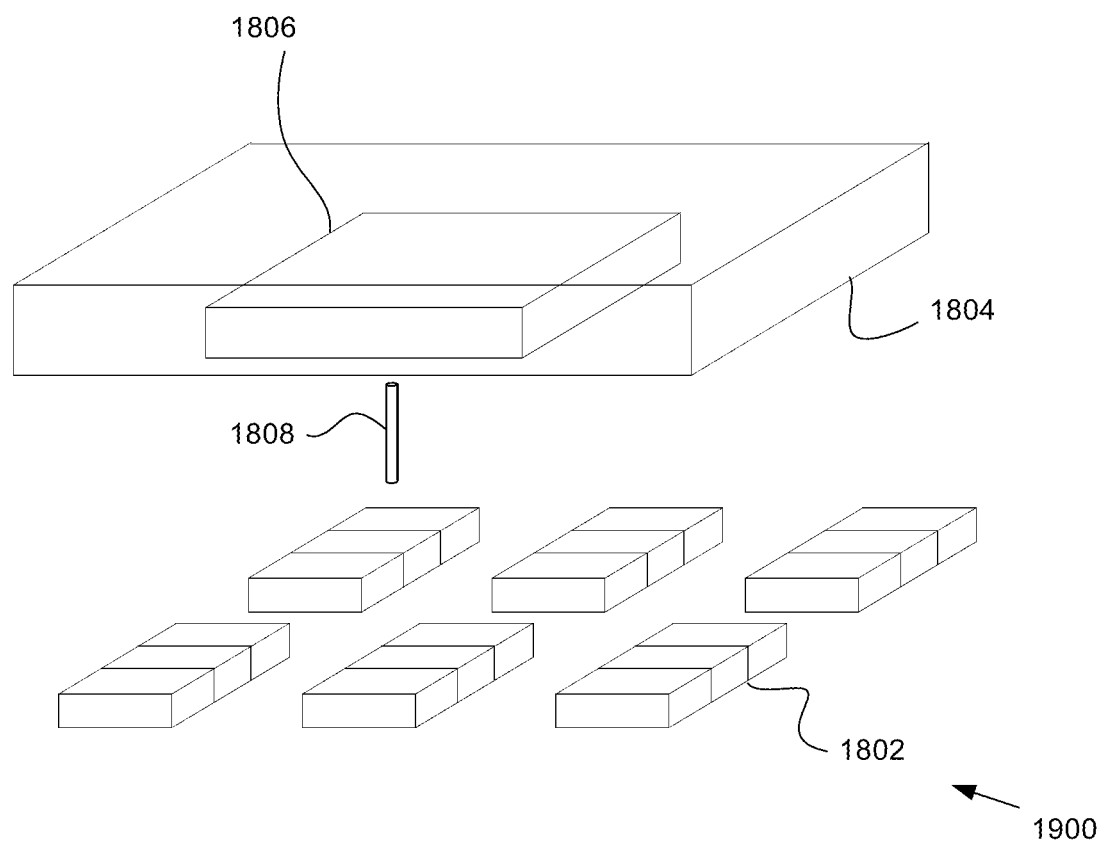
FIG. 19 is an exploded view of another embodiment of a stacked array.

FIG. 19 is an exploded view 1900 of one embodiment of stacked array 1800. As shown, attaching layer 1802 can include two or more passive devices. Interposer 1804 can include land patterns (not shown) corresponding to components in attaching layer 1802. Signals from the host PCB can be coupled through components in attaching layer 1802 through interposer 1804 to encapsulated device 1806.

Figure 20:
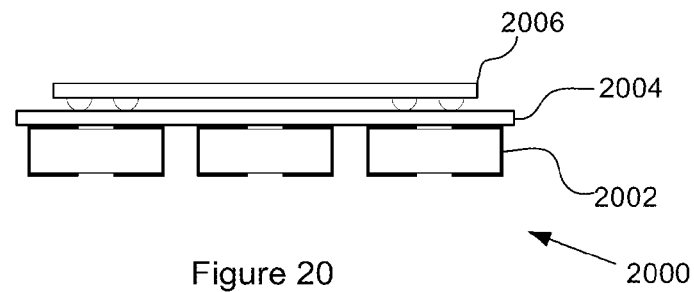
FIG. 20 is a block diagram of another embodiment of a stacked array.

FIG. 20 is a block diagram of another embodiment of stacked array 2000. Stacked array 2000 can include attaching layer 2002, interposer 2004 and integrated circuit 2006. Attaching layer 2002 can include passive components such as resistors, inductors, capacitors, diodes and the like. In one embodiment, integrated circuit 2006 can be a ball grid array. The stacked array 2000 can advantageously use passive components in the attaching layer 2002 to couple signals from a host PCB to the integrated circuit 2006. In this way, overall area usage can be reduced compared to traditional assembly methods which spread out passive components around and next to integrated circuit 2006.

Figure 21:
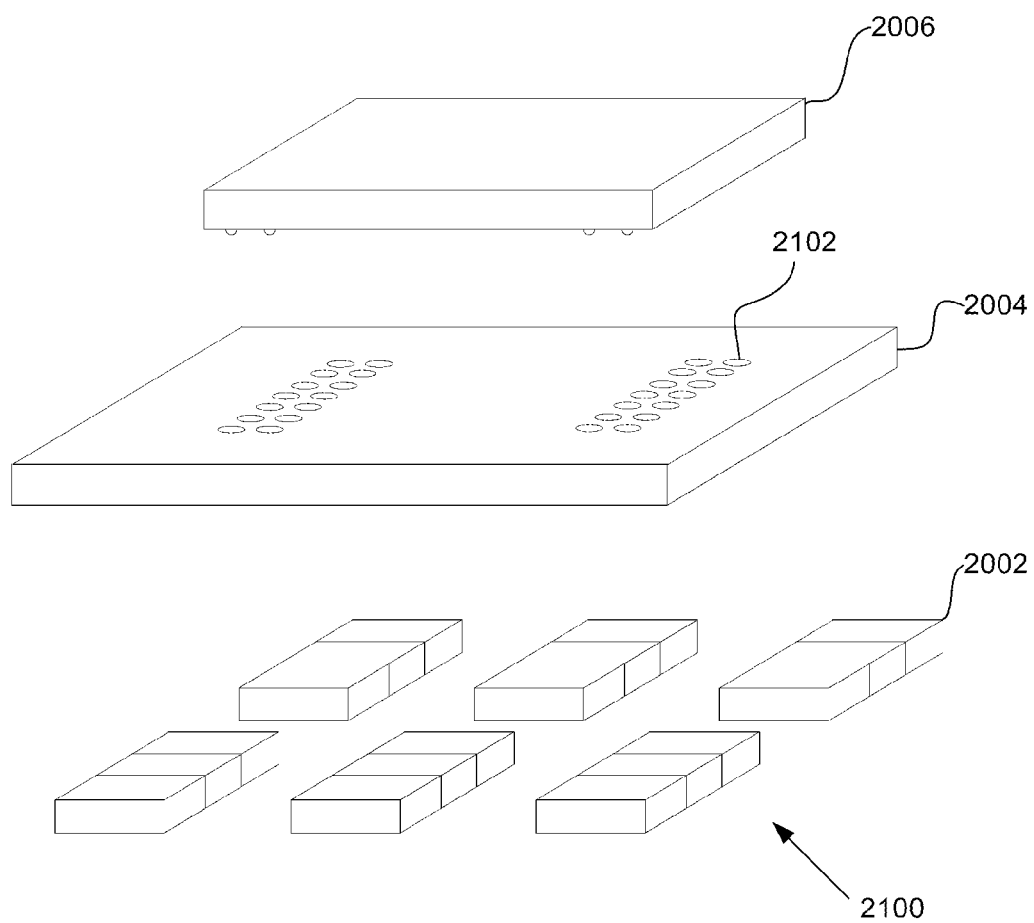
FIG. 21 is an exploded view of another embodiment of a stacked array.

FIG. 21 is an exploded view 2100 of one embodiment of stacked array 2000. The stacked array 2000 includes attaching layer 2002, interposer 2004 and integrated circuit 2006. The integrated circuit 2006 can be mounted to the interposer 2004 through the land pattern 2102 corresponding balls or other mounting features on the integrated circuit 2106. FIG. 21 shows how PCB surface area is saved through the use of stacked array 2000 by using passive components in the attaching layer to not only attached integrated circuit 2006 to the PCB, but also to couple signals to and from the integrated circuit 2006.

Figure 22:
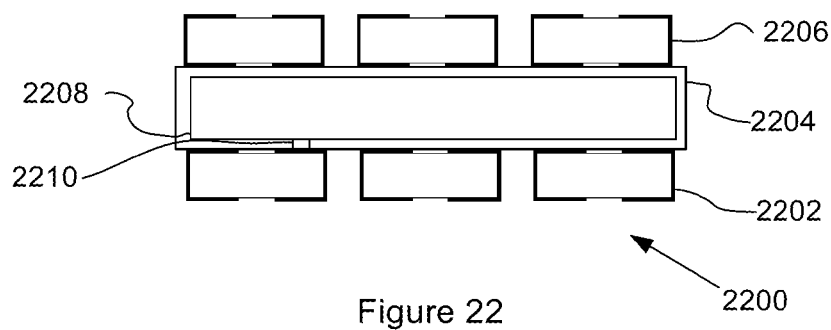
FIG. 22 is a block diagram of another embodiment of a stacked array.

FIG. 22 is a block diagram of another embodiment of a stacked array 2200. The stacked array 2200 can include attaching layer 2202, interposer 2204 and component layer 2206. The interposer 2204 can encapsulate an integrated circuit 2208. Components in the attaching layer 2202 and the component layer 2206 can be passive components. Signals from the attaching layer 2202 or the component layer 2206 can be coupled through the interposer 2204 using through vias or micro-vias 2210. Stacked array 2200 can increase circuit density beyond that available with traditional design techniques by stacking passive components both above and below integrated circuit 2208.

Figure 23:
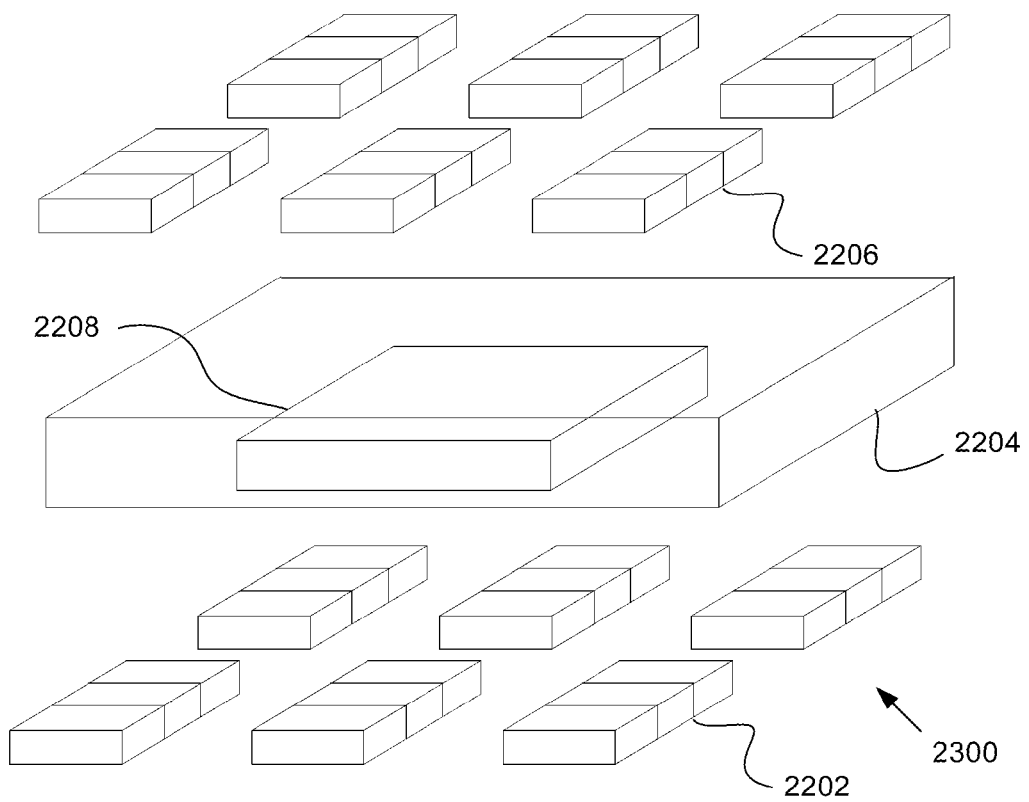
FIG. 23 is an exploded view of another embodiment of a stacked array.

FIG. 23 is an exploded view 2300 of one embodiment of the stacked array 2200. The stacked array 2200 includes attaching layer 2202, interposer 2204 and component layer 2206. The interposer 2204 can encapsulate an integrated circuit 2208. The components used within attaching layer 2202 and/or the component layer 2206 can be used to support the function of integrated circuit 2208. For example, components in the component layer 2206 can be decoupling capacitors that can decouple one or more power planes used by the integrated circuit 2208. Components in the attaching layer 2202 can be components used to couple signals from a host PCB (not shown) to the integrated circuit 2208. For example, small signals from a host PCB can be coupled through AC coupling capacitors in the attaching layer 2202 to the integrated circuit 2208. This arrangement of signal routing and parts placement can advantageously use less surface area on a host PCB than conventional surface mount parts placement.

Figure 24A:
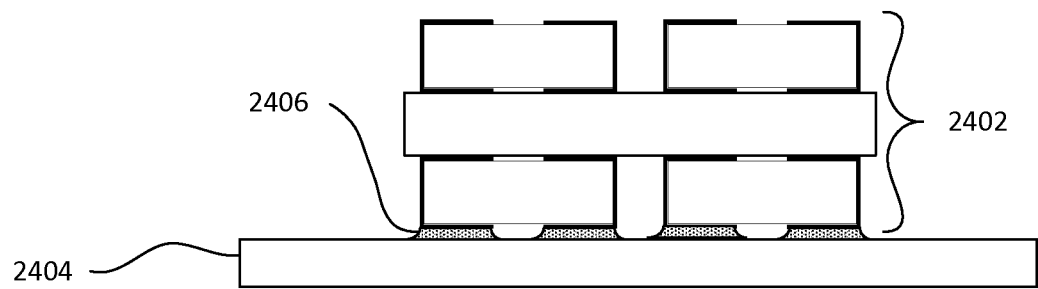
FIG. 24A illustrates one embodiment of a stacked array mounted on a host PCB.
Figure 24B:
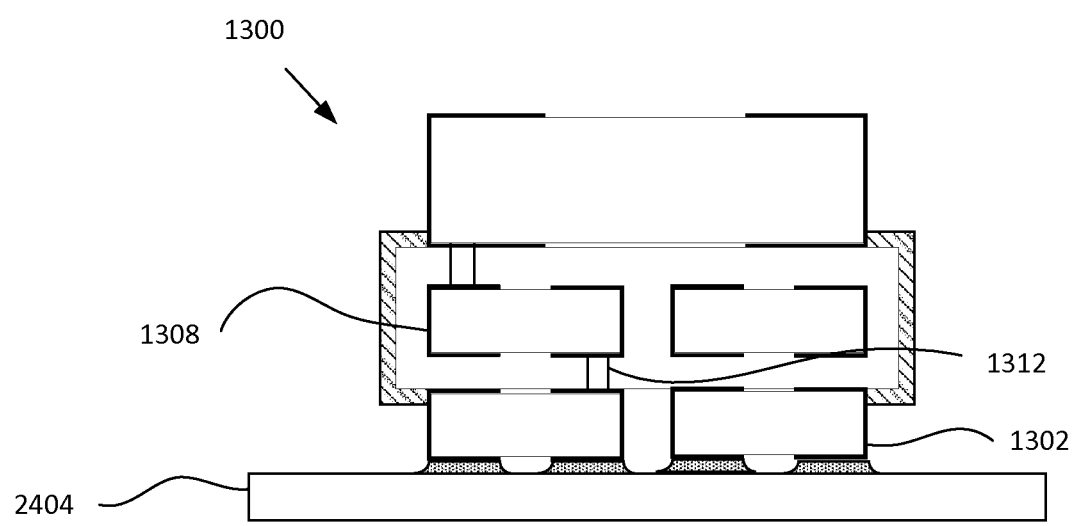
FIG. 24B illustrates the stacked array of FIG. 13 mounted on a host PCB.

Any embodiments of the stacked array described herein can be integrated into a design by coupling the components within the attaching layer to a host. Oftentimes, the host is a host printed circuit board (PCB). FIG. 24A illustrates one embodiment of a stacked array 2402 mounted on host PCB 2404. Stacked array 2402 can include attaching layer 2406. In this embodiment, attaching layer 2406 can be coupled to host PCB 2404 through solder connections 2406. Solder connections 2406 can mechanically secure stacked array 2402 to host PCB 2404. The solder connections can also couple electrical signals from host PCB 2404 to stacked array 2402 and from stacked array 2402 to host PCB 2404. FIG. 24B illustrates another embodiment in which stacked array 1300 is mounted on host PCB 2404. In this embodiment, the passive components included in attaching layer 1302 can be coupled to host PCB 2404. Stacked array 1300 can use passive components in the attaching layer 1302 to couple signals from host PCB 2404 to encapsulated components 1308 using micro-vias or through vias 1312. Host PCB 2404 can be a printed circuit board, a flex circuit board, a semi-rigid circuit board or other technically suitable host to which the stacked array 2402 can attach. Host PCB 2404 can couple signals to and from stacked array 2402. Host PCB 2404 supporting stacked array 2402 can be used in mobile devices, cell phones, personal digital assistants, media players, computing devices, and other electronic devices.

Figure 25:
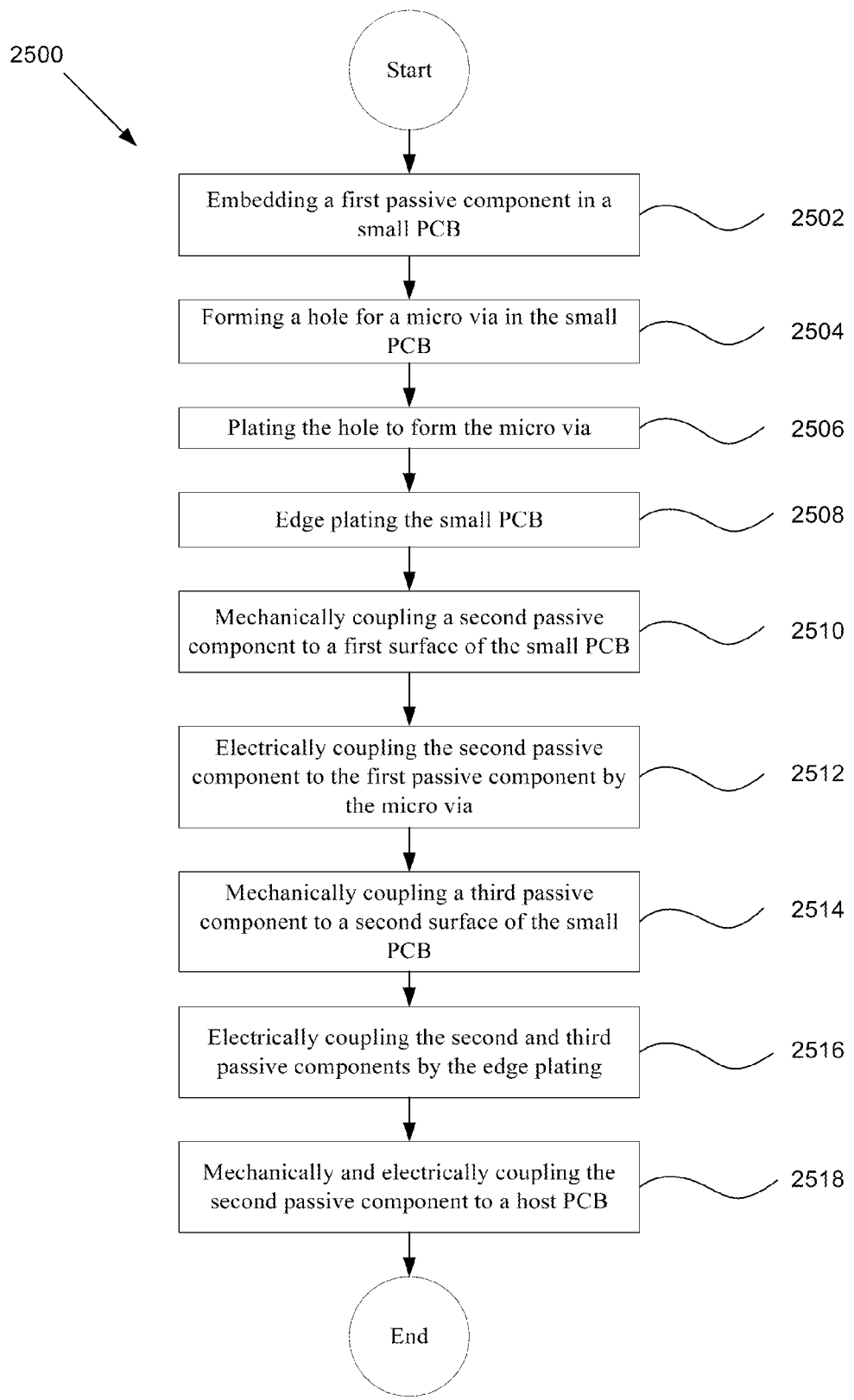
FIG. 25 is a flow chart describing a process for assembling a stacked array.

FIG. 25 is a flow chart describing a process 2500 for assembling a stacked array; in some embodiments the stacked array can be referred to as a vertically stacked integrated array. In a first step 2502, a first passive component is embedded within a small printed circuit board (PCB). Depending on the size of the first passive component a number of passive components could be embedded within the small PCB. This layer of embedded components can be collectively referred to as an intermediate component layer. In a proximate step 2504 a hole is formed for a micro-via allowing an electrical connection to run from within the small PCB to a surface of the small PCB. In step 2506 the hole can be plated with a conductive metal. The conductive metal can run from a connector on the first passive component to a first surface of the small PCB. In step 2508 edge plating can be added to a peripheral portion of the small PCB allowing communication between the first surface of the small PCB and a second surface of the small PCB. In step 2510 a second passive component is added to a first surface of the small PCB. In step 2512 the second passive component can be electrically coupled to the first passive component by the micro-via either in a direct connection between the second passive component and the micro-via or by an electrical trace running from an electrical connector of the second passive component to the micro-via. In step 2514 a third passive component is mechanically coupled to the second surface of the small PCB and in step 2516 the second and third passive components are electrically coupled by the edge plating. In one embodiment the second and third components can both be in direct contact with the edge plating, thereby allowing an electrical attachment without any additional electrical traces being added to the small PCB. In a final step 2518 the second passive component can be mechanically and electrically coupled to a host PCB. In this way the stacked area can be surface mounted in a non-traditional way; the mounting is accomplished directly through a passive component as opposed to other more complex surface mounting processes that can require more components and more space on the host PCB.

The various aspects, embodiments, implementations or features of the described embodiments can be used separately or in any combination. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A vertically stacked integrated array, comprising:
a substrate having a first surface and a second surface, the second surface opposite the first surface;
a first passive component coupled to the first surface;
a support component coupled to the second surface and suitable for mechanical attachment to a host printed circuit board (PCB) such that the support component substantially supports the vertically stacked integrated array on the host PCB, wherein the support component comprises a first discrete terminal and a second discrete terminal, the first discrete terminal configured to electrically couple the support component to an external circuit arranged on the host PCB;
edge plating disposed along a first edge and a second edge of the substrate, the edge plating electrically coupling the first passive component to the second discrete terminal;
a second passive component encapsulated within the substrate, the second passive component disposed between the first edge and the second edge of the substrate; and
an electrically conductive pathway disposed substantially within the substrate, the electrically conductive pathway electrically coupling the second passive component to the support component.

2. The vertically stacked integrated array as recited in claim 1, wherein the support component is an inductor.

3. The vertically stacked integrated array as recited in claim 1, wherein the support component is a diode.

4. The vertically stacked integrated array as recited in claim 1, wherein the support component is a resistor.

5. The vertically stacked integrated array as recited in claim 1, wherein the support component is a capacitor.

6. The vertically stacked integrated array as recited in claim 1, wherein the electrically conductive pathway is a via.

7. The vertically stacked integrated array as recited in claim 1, wherein the second passive component is electrically coupled to the external circuit by way of the electrically conductive pathway and the support component.

8. The vertically stacked integrated array as recited in claim 1, wherein the first passive component is a high frequency decoupling capacitor, the second passive component is a mid-range decoupling capacitor and the support component is a bulk decoupling capacitor.

9. The vertically stacked integrated array as recited in claim 1, wherein the first edge is opposite the second edge.

10. The vertically stacked integrated array as recited in claim 1, wherein the substrate is a PCB.

11. The vertically stacked integrated array as recited in claim 1, wherein the first passive component, the second passive component, and the support component are electrically coupled in parallel.

12. A vertically stacked integrated array, comprising:
a substrate having a first surface and a second surface, the second surface opposite the first surface;
a first passive component coupled to the first surface;
a plurality of support components coupled to the second surface and suitable for mechanical attachment to a host printed circuit board (PCB) such that the plurality of support components substantially supports the vertically stacked integrated array on the host PCB, wherein each of the support components comprises at least two discrete terminals, and wherein a first discrete terminal of at least one of the support components is configured to be electrically coupled to circuitry of the host PCB;
a first and second conductive edge plate disposed on the substrate, wherein at least one of the first and second conductive edge plates electrically couples the first passive component to a second discrete terminal of the at least one support component;
a second passive component encapsulated within the substrate and disposed between the first and second conductive edge plates; and
an electrically conductive pathway disposed substantially within the substrate, the electrically conductive pathway electrically coupling the second passive component to at least one of the support components.

13. The vertically stacked integrated array as recited in claim 12, wherein at least one of the support components is selected from the group consisting of a resistor, an inductor, a capacitor and a diode.

14. The vertically stacked integrated array as recited in claim 12, wherein the plurality of support components are electrically coupled in series.

15. The vertically stacked integrated array as recited in claim 12, wherein the first passive component, the second passive component, and one or more of the support components are electrically coupled in parallel.

16. The vertically stacked integrated array as recited in claim 12, wherein the first and second conductive edge plates are disposed on opposite ends of the substrate.

17. The vertically stacked integrated array as recited in claim 12, wherein the electrically conductive pathway is a via.

18. The vertically stacked integrated array as recited in claim 12, wherein the second passive component is electrically coupled to the host PCB by way of the electrically conductive pathway and one or more of the support components.

19. The vertically stacked integrated array as recited in claim 12, wherein the first passive component is a high frequency decoupling capacitor, the second passive component is a mid-range decoupling capacitor and at least one of the support components is a bulk decoupling capacitor.

* * * * *